US012602015B2

(12) United States Patent
Saito et al.

(10) Patent No.: US 12,602,015 B2
(45) Date of Patent: Apr. 14, 2026

(54) ELECTRONIC DEVICE AND METHOD FOR ASSEMBLING ELECTRONIC DEVICE

(71) Applicant: CASIO COMPUTER CO., LTD., Tokyo (JP)

(72) Inventors: Yuta Saito, Tachikawa (JP); Sae Uchibayashi, Akishima (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 542 days.

(21) Appl. No.: 18/145,425

(22) Filed: Dec. 22, 2022

(65) Prior Publication Data

US 2023/0205143 A1    Jun. 29, 2023

(30) Foreign Application Priority Data

Dec. 22, 2021    (JP) ................................. 2021-207870

(51) Int. Cl.
*G04C 10/02* (2006.01)
*G04D 3/00* (2006.01)
(Continued)

(52) U.S. Cl.
CPC ........... *G04C 10/02* (2013.01); *G04D 3/0002* (2013.01); *H02S 40/22* (2014.12); *H10F 19/90* (2025.01)

(58) Field of Classification Search
CPC ........ G04C 10/00; G04C 10/02; G04C 10/04; G04D 3/00; G04D 3/0002; G04D 3/0005; G04D 3/0007; G04D 3/001; G04D 3/0043; G04D 3/0061; G04D 3/0064; G04G 17/00; G04G 17/02; G04G 17/04; G04G 17/045; G04G 17/08; G04G 17/083; G04G 19/00; G04G 19/02; H02S 40/00; H02S 40/20; H02S 40/22; H10F 19/00; H10F 19/90; H10F 19/902; H10F 19/904; H10F 19/906; H10F 19/908
See application file for complete search history.

(56) References Cited

U.S. PATENT DOCUMENTS

| | | | | | |
|---|---|---|---|---|---|
| 4,276,629 A | * | 6/1981 | Matsumura | ............ | G04C 10/02 |
| | | | | | 368/218 |
| 4,553,851 A | * | 11/1985 | Matsumoto | ............ | G04C 10/02 |
| | | | | | 368/203 |

(Continued)

FOREIGN PATENT DOCUMENTS

| | | |
|---|---|---|
| JP | 2001264460 A | 9/2001 |
| JP | 2003270366 A | 9/2003 |
| JP | 2004286620 A | 10/2004 |

OTHER PUBLICATIONS

Notice of Reasons for Refusal dated Oct. 7, 2025 received in Japanese Patent Application No. 2021-207870.

*Primary Examiner* — Georgia Y Epps
(74) *Attorney, Agent, or Firm* — Scully, Scott, Murphy & Presser, P.C.

(57)    ABSTRACT

An electronic device includes a cylindrical case, a display, an annular light-transmitting parting member, an annular solar cell and an annular elastic member. At least the upper end of the case is open. The display is disposed in the case and exposed to a side where the upper end is located. The parting member is annular along the inner circumferential surface of the case. The annular solar cell is disposed under the parting member. The elastic member fixes the outer edge of the annular solar cell.

20 Claims, 5 Drawing Sheets

(51) Int. Cl.
    *H02S 40/22*        (2014.01)
    *H10F 19/90*       (2025.01)

(56)            References Cited

U.S. PATENT DOCUMENTS

| | | | | |
|---|---|---|---|---|
| 6,094,404 | A * | 7/2000 | Hidai | H10F 19/80 |
| | | | | 368/205 |
| 7,400,556 | B2 * | 7/2008 | Osa | G04C 10/02 |
| | | | | 368/204 |
| 9,423,775 | B2 * | 8/2016 | Saito | G04C 10/02 |
| 9,709,959 | B2 * | 7/2017 | Kanno | G04G 17/08 |
| 11,126,147 | B2 * | 9/2021 | Hidai | H10F 10/14 |
| 12,204,286 | B2 * | 1/2025 | Saito | G04B 19/12 |
| 2006/0153011 | A1 * | 7/2006 | Osa | G04C 10/02 |
| | | | | 368/205 |
| 2015/0346695 | A1 * | 12/2015 | Saito | H10F 19/31 |
| | | | | 368/205 |
| 2017/0038743 | A1 * | 2/2017 | Sawada | G04B 19/30 |
| 2019/0271953 | A1 * | 9/2019 | Hidai | H10F 10/14 |
| 2020/0301371 | A1 * | 9/2020 | Kitamura | G04G 17/06 |
| 2021/0255587 | A1 * | 8/2021 | Saito | G04G 19/10 |
| 2023/0195044 | A1 * | 6/2023 | Saito | G04C 3/008 |
| | | | | 368/205 |
| 2023/0205143 | A1 * | 6/2023 | Saito | H10F 19/90 |
| 2024/0103450 | A1 * | 3/2024 | Sano | H01Q 1/273 |
| 2024/0178333 | A1 * | 5/2024 | Saito | G04G 19/00 |
| 2024/0322050 | A1 * | 9/2024 | Saito | G04B 19/04 |
| 2025/0076816 | A1 * | 3/2025 | Kunimi | G04C 10/02 |
| 2025/0076817 | A1 * | 3/2025 | Kunimi | G04C 10/02 |
| 2025/0110449 | A1 * | 4/2025 | Saito | G04B 19/12 |
| 2025/0123594 | A1 * | 4/2025 | Saito | G04B 19/30 |

* cited by examiner

FIG. 5

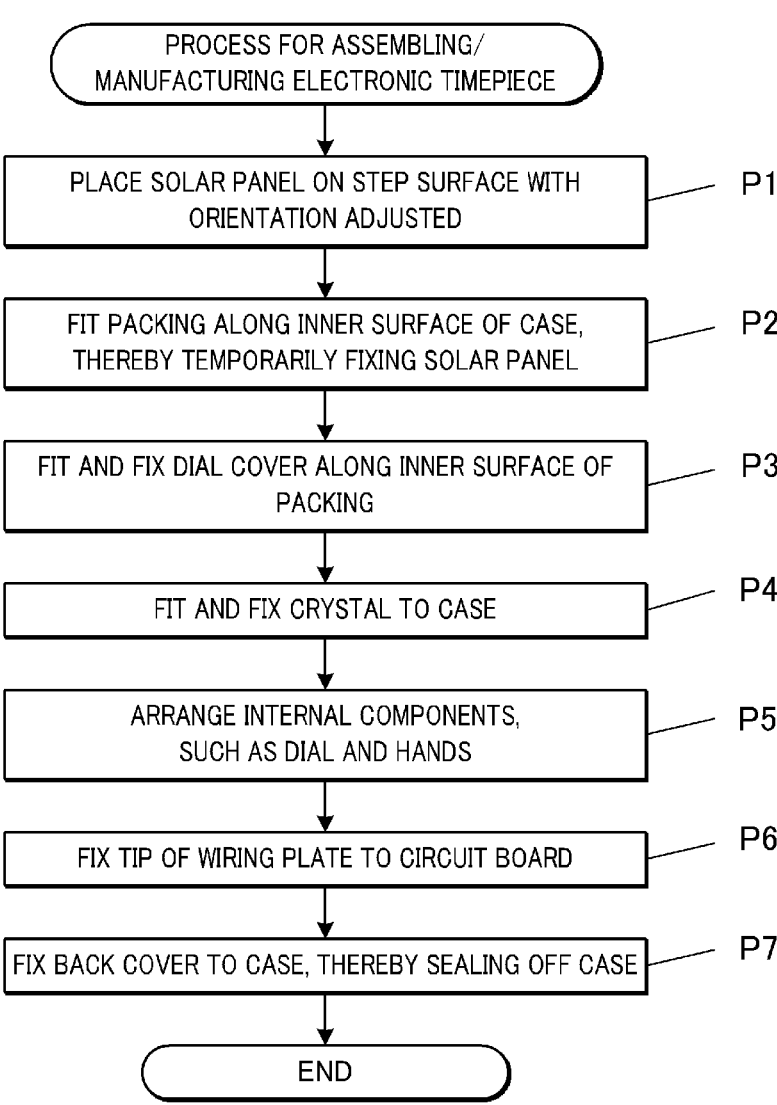

PROCESS FOR ASSEMBLING/
MANUFACTURING ELECTRONIC TIMEPIECE

PLACE SOLAR PANEL ON STEP SURFACE WITH
ORIENTATION ADJUSTED — P1

FIT PACKING ALONG INNER SURFACE OF CASE,
THEREBY TEMPORARILY FIXING SOLAR PANEL — P2

FIT AND FIX DIAL COVER ALONG INNER SURFACE OF
PACKING — P3

FIT AND FIX CRYSTAL TO CASE — P4

ARRANGE INTERNAL COMPONENTS,
SUCH AS DIAL AND HANDS — P5

FIX TIP OF WIRING PLATE TO CIRCUIT BOARD — P6

FIX BACK COVER TO CASE, THEREBY SEALING OFF CASE — P7

END

ELECTRONIC DEVICE AND METHOD FOR ASSEMBLING ELECTRONIC DEVICE

BACKGROUND OF THE INVENTION

Field of the Invention

The present disclosure relates to an electronic device and a method for assembling an electronic device.

Description of the Related Art

In a portable electronic device that is used in a wide range of environments, in order that a display screen be secured appropriately and also waterproofness, dust-proofness and so forth be obtained, a transparent crystal is disposed so as to cover the display screen. Meanwhile, in such a portable electronic device, light entering inside through the crystal is often used for solar power generation.

There is a solar panel disposed so as to cover the display surface (display) of a dial. If such a configuration is applied to an electronic device that performs display using hands, the electronic device has a problem that its power generation efficiency is low in proportion to its area because of shadows of the hands. In JP 2003-270366 A, there is disclosed an electronic timepiece in which a solar panel is disposed along the side surface of a space between a display and a crystal.

SUMMARY OF THE INVENTION

According to an aspect of the present disclosure, there is provided an electronic device including:
  a cylindrical case with at least an upper end open;
  a display disposed in the case and exposed to a side where the upper end is located;
  an annular light-transmitting parting member along an inner circumferential surface of the case;
  an annular solar cell disposed under the parting member; and
  an annular elastic member that fixes an outer edge of the annular solar cell.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments, and together with the general description given above and the detailed description of the embodiments given below, serve to explain the principles of the present disclosure, wherein:

FIG. 5 is a flowchart of a process for assembling/manufacturing the electronic timepiece.

DESCRIPTION OF THE EMBODIMENTS

Hereinafter, one or more embodiments of the present disclosure will be described with reference to the drawings.

Figure 1A:
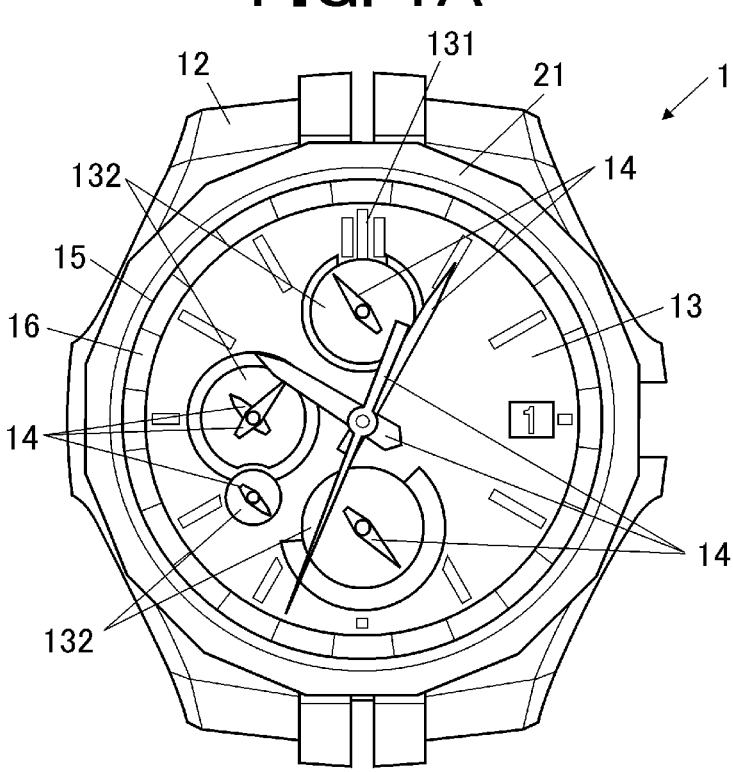
FIG. 1A is a plane/top view of an electronic timepiece that is an electronic device according to an embodiment(s)
Figure 1B:
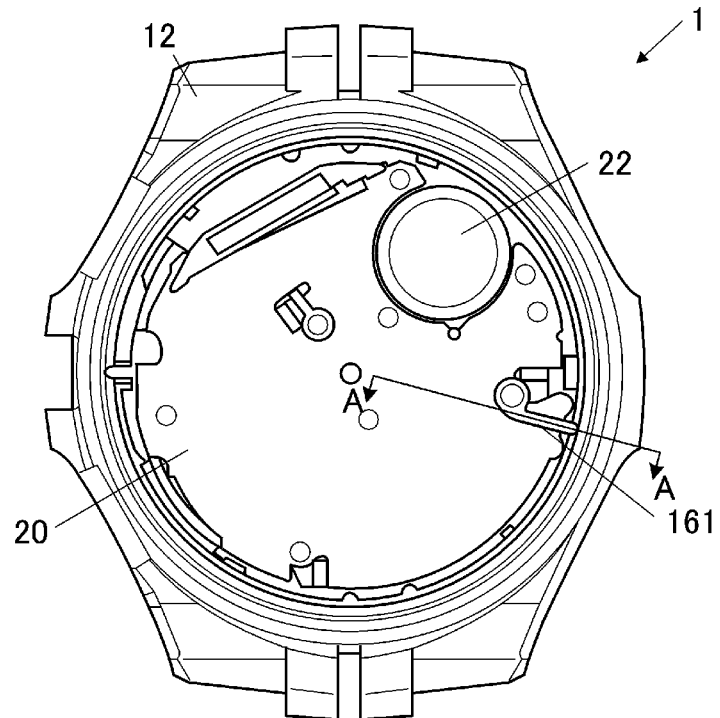
FIG. 1B is a bottom view of the electronic timepiece.

FIG. 1A is a plane/top view of an electronic timepiece 1 that is an electronic device according to an embodiment(s). FIG. 1B is a bottom view of the electronic timepiece 1. This bottom view shows the electronic timepiece 1 with a back cover 18 (shown in FIG. 2) detached.

The electronic timepiece 1 includes a case 12, a dial 13, hands 14, a dial cover 15 (parting member), and a circuit board 20. Through the dial cover 15, a solar panel 16 (solar cell(s)) disposed thereunder is visible. The hands 14 are covered, from the above, with a light-transmitting, transparent in this embodiment, crystal 17 (light-transmitting member, shown in FIG. 2). The hands 14 are disposed between the dial 13 and the crystal 17 (i.e., on the dial 13) so as to be rotatable in planes parallel to the dial 13. To the outside of the case 12, a decorative member 21, such as a bezel, may be attached as appropriate.

The case 12 is cylindrical with the upper end and the lower end open. In the circular space (i.e., inside the case 12), for example, the following are housed; the dial 13, the hands 14, the dial cover 15 and the circuit board 20, which are mentioned above, and a drive unit including a wheel train mechanism, which is a gear train, and a stepping motor that rotate the hands 14, and a battery 22 (rechargeable battery). The lower end of the case 12 is sealed with the back cover 18 (shown in FIG. 2) and the upper end thereof is sealed with the crystal 17 to prevent water, dust and so forth from entering the case 12. The case 12 is not limited to but stainless steel, for example.

The dial 13 is disposed so as to be exposed to the upper end side of the case 12. On the upper surface (exposed surface) of the dial 13, indexes 131 (hour marks) for indicating time are disposed for respective hours (at intervals of 30 degrees). On the upper surface of the dial 13, marks for indicating time in units of minutes and seconds may also be disposed, for example.

The center of the dial 13 is the rotational axis of at least some of the hands 14, for example, an hour hand, a minute hand and a second hand. The other hands 14 may be small hands that rotate in small windows 132 that occupy part of the upper surface of the dial 13.

The dial 13 and the hands 14 constitute a display of this embodiment.

The dial cover 15 is an annular member disposed near and along the upper end of the inner circumferential surface (inner surface) of the case 12, and defines, from above the dial 13, a visible area of the dial 13 that a user can see. The "near and along the upper end of the inner circumferential surface" does not mean being in contact with the upper end. The upper surface of the dial cover 15 may be disposed lower than the upper end of the case 12. The dial cover 15 of the electronic timepiece 1 of this embodiment is a light-transmitting member, such as resin. The dial cover 15 does not need to be transparent, and may be a colored light-transmitting member.

The solar panel 16 is formed of a plurality of solar cells 160 (shown in FIG. 3A) arranged in line to be annular, and disposed under the dial cover 15 to receive light incident thereon through the dial cover 15, thereby generating electric power. The "annular" is not limited to being perfectly and continuously circumferential or annular. The "annular" could indicate a shape having small gaps (e.g., between the solar cells 160). The solar panel 16 may be a film-like panel, which is thinner and less rigid than a plate-like panel.

The circuit board 20 is disposed on the back surface side (lower side) in the case 12, and operates with electric power supplied through a wiring plate 161 extending from the solar panel 16. Operation of the circuit board 20 includes operation as an electronic timepiece, namely operation as a time counter that counts the current time and operation as a display controller that causes the drive unit, which rotates the hands 14 in sync with the current time, to operate to cause the hands 14 to display the current time.

Figure 2:
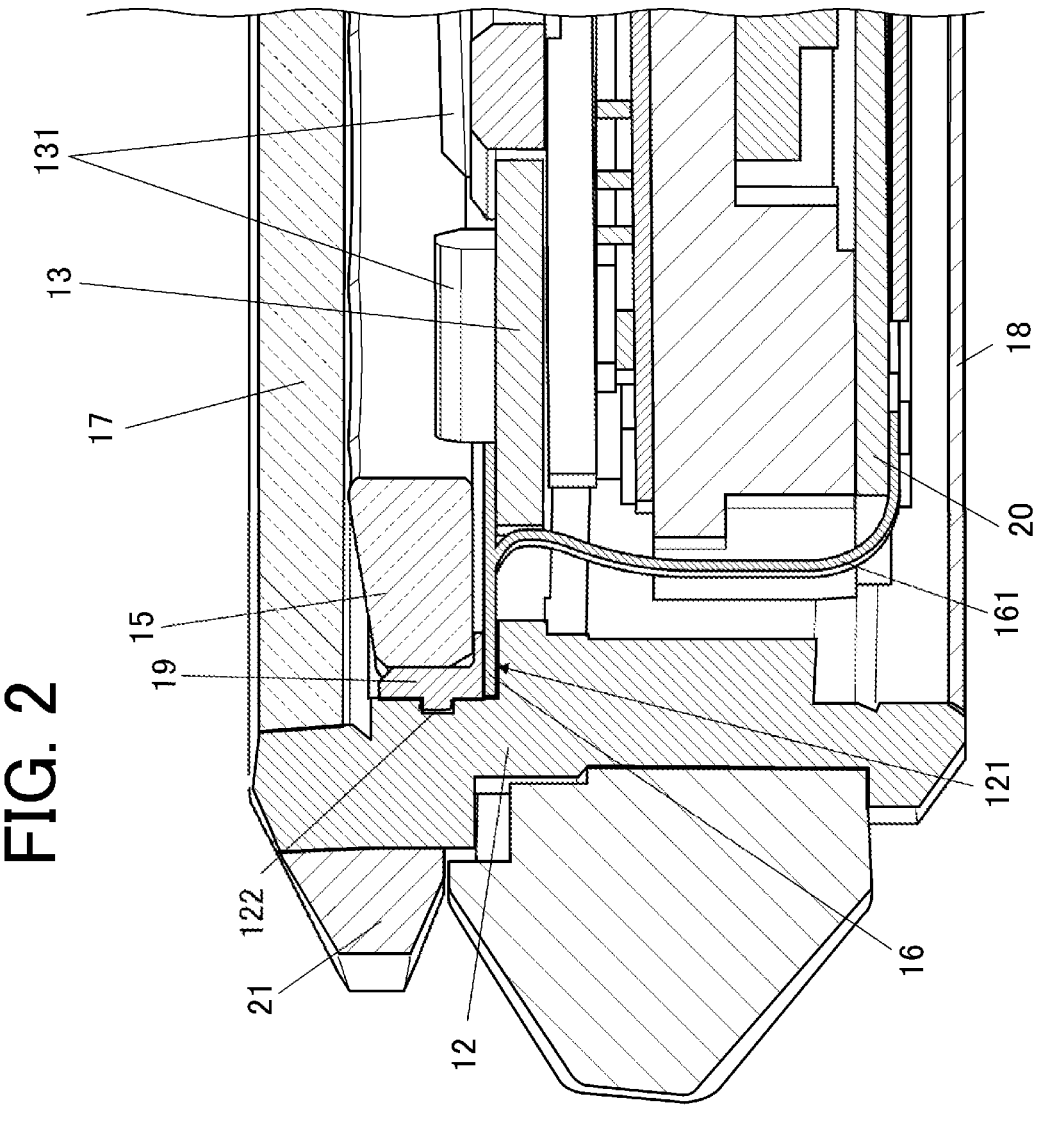
FIG. 2 is a sectional view of the electronic timepiece, passing through the center thereof.

FIG. 2 is a sectional view of the electronic timepiece 1, passing through the center thereof, perpendicular to the bottom surface and taken along line A-A in FIG. 1B. In FIG. 2, the hands 14 are omitted.

Inside the case 12, the drive unit for the hands 14 and the circuit board 20 are disposed under the dial 13. The open lower surface (lower end) of the case 12 is sealed with the back cover 18. To the upper end of the inner circumferential surface of the case 12, the crystal 17 (light-transmitting member) is fitted.

The upper portion of the inner circumferential surface of the case 12 is stepwise outward, and the upper end of this portion forms an opening (open upper end/surface) of the case 12. The solar panel 16 is disposed on an annular step surface 121 with which the stepwise portion is provided. The inner diameter of the case 12 above the step surface 121 is larger than that of the case 12 under the step surface 121. The dial cover 15 disposed above the solar panel 16 is fitted in the large space, which is above the step surface 121 of the case 12, along the inner circumferential surface of the case 12 via an annular packing 19 (elastic member). That is, the dial cover 15 is not in direct contact with the case 12.

The lower end of the packing 19 reaches the step surface 121, and the outer edge of the solar panel 16 is fixed to the step surface 121 by the packing 19. This makes it unnecessary to use an adhesive, such as glue or double-sided tape, to fix the solar panel 16, and accordingly does not cause deterioration in external appearance of the electronic timepiece 1 due to an adhesive being visible through the dial cover 15. Further, since no adhesive is used, the solar panel 16 hardly slides from its original position, in particular, hardly leaves the step surface 121 and comes into contact with the dial cover 15.

The packing 19 is partly interposed between the solar panel 16 and the dial cover 15, thereby separating the solar panel 16 and the dial cover 15 from one another. For this purpose, the sectional shape of the packing 19 may be L-shaped as shown in FIG. 2. Further, as shown in FIG. 2, the dimension of the interposed portion of the packing 19 between the solar panel 16 and the dial cover 15 in the horizontal direction (i.e., width thereof in the radius direction of the open surface(s) of the case 12) may be sufficiently short as compared with that of the dial cover 15. If the solar panel 16 is in contact with the dial cover 15, moiré appears as viewed from the above because of refraction and interference of light between these components. Fixing the solar panel 16 and the dial cover 15 in the state in which they are separated from one another prevents moiré from appearing. If the dial cover 15 is fitted in the state of being in contact with the solar panel 16, their contact surfaces are scratched, which may lead to deterioration in the external appearance or decrease in the power generation efficiency. Separating the solar panel 16 and the dial cover 15 from one another also prevents such scratches from being made.

The packing 19 is a conventionally-known elastic resin member, such as rubber, and may be waterproof. The stepwise portion of the inner circumferential surface of the case 12 has an annular depression 122 in a portion with which the packing 19 comes into contact. The packing 19 pressed by fitting of the dial cover 15 partly expands into the depression 122. This prevents (or reduces) the packing 19 from expanding upward along the inner circumferential surface of the case 12, and accordingly, if not prevents, reduces deterioration in the external appearance of the electronic timepiece 1 viewed from the above (i.e., from the upper surface side).

To the solar panel 16, one end of the wiring plate 161 (wiring part) is connected. The wiring plate 161 curvedly extends downward from this one end along the inner circumferential surface of the case 12, and its tip (other end) is connected to the circuit board 20. The wiring plate 161 is flexible, so that its curved shape can be easily adjusted. On the wiring plate 161, two signal lines extend, and to between the signal lines, voltage difference made in response to electric power generation is applied, and generated electric power is transmitted to a power supply circuit of the circuit board 20.

The wiring plate 161 may be integrated with the solar panel 16, or may be a separate component from the solar panel 16 and connected and fixed to the solar panel 16.

Where the wiring plate 161 branches off from the solar panel 16 is a position outward from the inner edge of the solar panel 16, which is annular. Hence, the wiring plate 161 does not greatly protrude inward from the inner edge of the solar panel 16, namely does not protrude or, even if it does, protrudes by a small width, without making the minimum value of curvature for the curved shape of the wiring plate 161 significantly small.

Figure 3A:
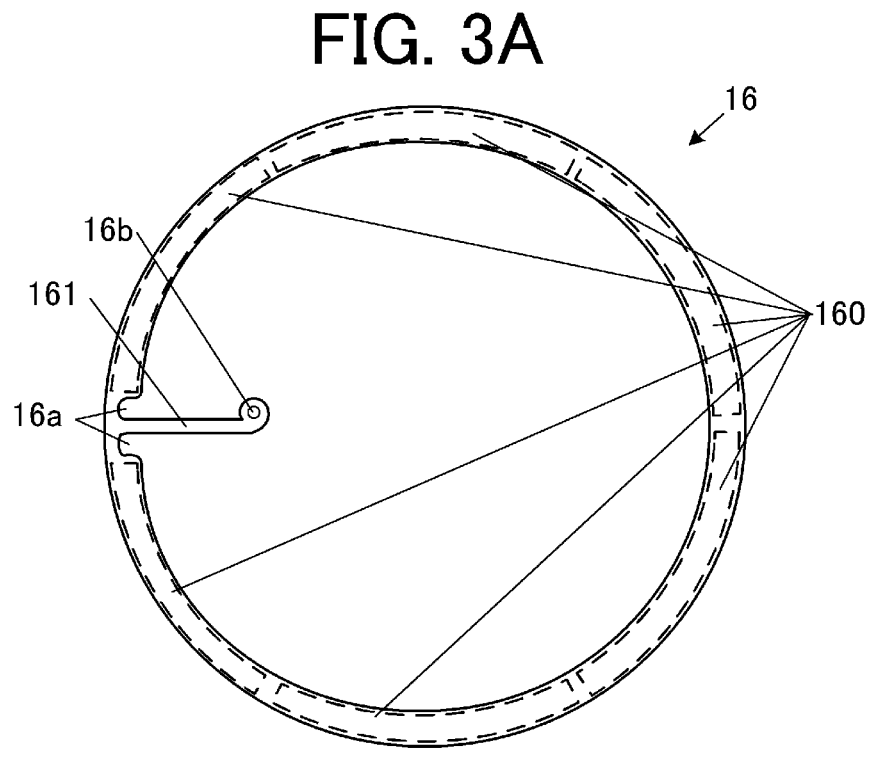
FIG. 3A is an illustration to explain a solar panel.
Figure 3B:
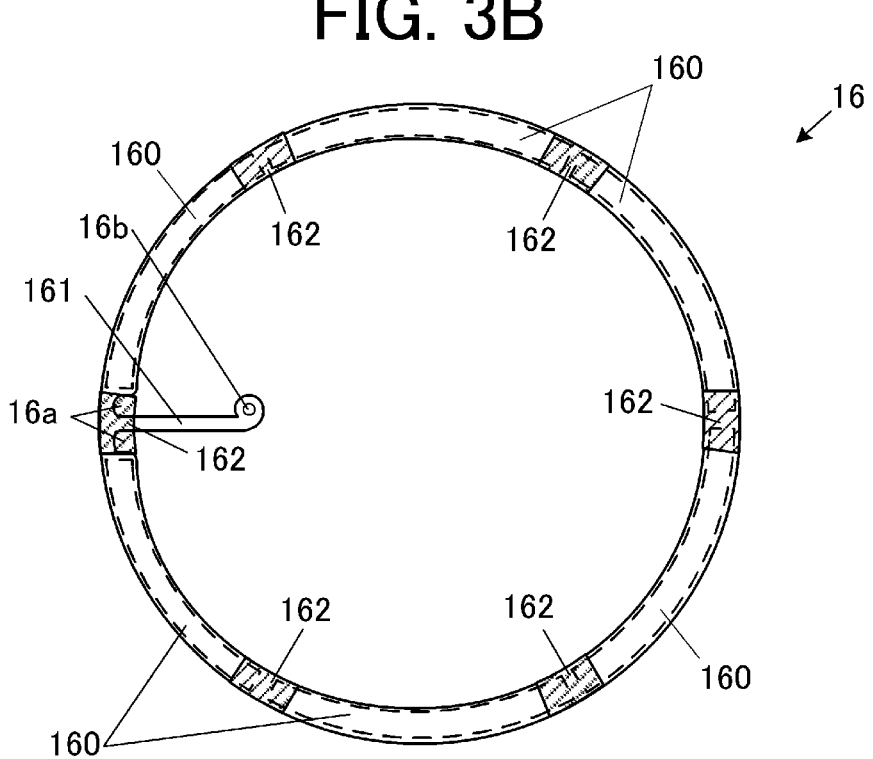
FIG. 3B is an illustration to explain the solar panel.

FIG. 3A and FIG. 3B are each a plan view of the solar panel 16 detached from the electronic timepiece 1 and unfolded.

As shown in FIG. 3A, the solar panel 16 is formed of solar cells, six solar cells 160 in this embodiment, arranged in line in the circumferential direction. The solar panel 16 has a notch 16a (notch) in its inner edge (inner circumference side), and the wiring plate 161 branches off at the notch 16a. The wiring plate 161 has a hole 16b in the tip (other end), and a screw (any common screw member, e.g., screw, bolt, etc.) that passes through the hole 16b is fixed to the circuit board 20, thereby fixing the wiring plate 161 thereto. Fixing the wiring (signal lines) extending on the wiring plate 161 to a terminal of the circuit board 20 in the state in which they are in contact with one another supplies electric power generated by the solar panel 16 to the circuit board 20.

When viewed from the above, the notch 16a, the connection position where the wiring plate 161 is connected to the solar panel 16, and the step surface 121 under the notch 16a are visible through the dial cover 15. The visible portion of the step surface 121 may be processed to have a color similar to the color of the solar panel 16. Alternatively, as shown in FIG. 3B, of the solar panel 16, a portion including the notch 16a and other portions may be provided with coating films 162 by, for example, metal deposition, to have a color similar to the color of the step surface 121. As a result, on the solar panel 16, a pattern is formed with the coating films 162 and the step surface 121 as a whole. This pattern may be a stripe pattern formed by disposing the coating films 162 at intervals of a certain angle, for example. At the portions where metal is deposited, the power generation efficiency decreases. Although it depends on the thickness and type of the coating films 162, the power generation efficiency thereat is, for example, about half the power generation efficiency at the portions where no coating film 162 is provided. However, as far as the metal-deposited area is sufficiently small to the entire area, decrease in the power generation efficiency as a whole does not become a problem. Further, at the boundaries between the solar cells 160, gaps are present, and no electric power is generated thereat.

Hence, the coating films 162 may be provided to include/cover these boundaries. This further reduces decrease in the power generation efficiency.

Figure 4:
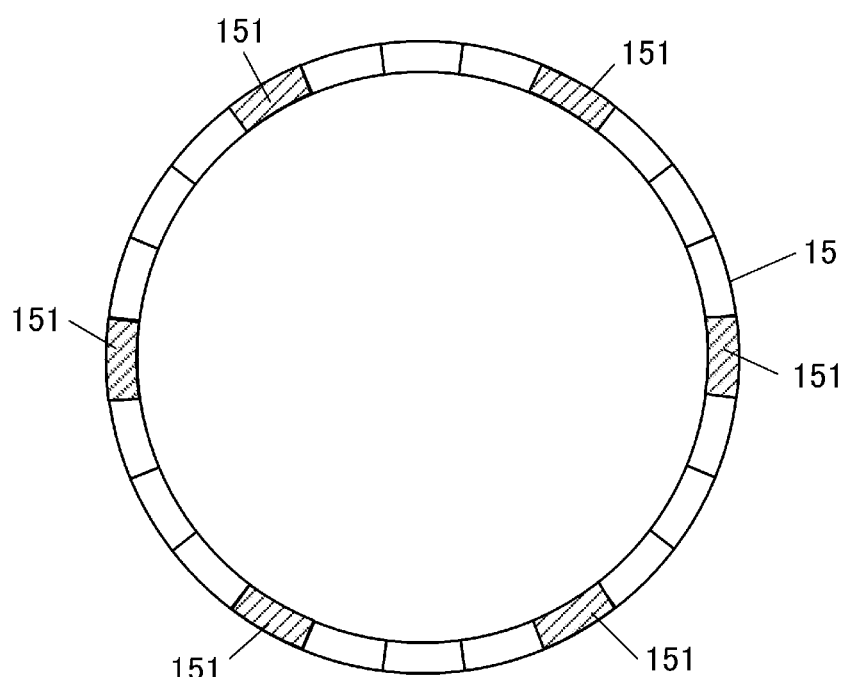
FIG. 4 is a plan view showing an example of a dial cover.

Alternatively, as shown in FIG. 4 that is a plan view showing an example of the dial cover 15, instead of the solar panel 16 having the coating films 162, the dial cover 15 may have coating films 151 on its lower surface (bottom surface side) so as to cover portions corresponding to, of the solar panel 16, portions desired to be invisible. In this case, the orientation of the dial cover 15, in the rotational direction in particular, needs to be adjusted as appropriate with respect to the solar panel 16.

FIG. 5 is a flowchart of a process for assembling/manufacturing the electronic timepiece 1. In the process for assembling/manufacturing the electronic timepiece 1, which is a method for assembling an electronic device according to this embodiment, the solar panel 16 is placed on the step surface 121 of the case 12 by taking account of the fixing position where the wiring plate 161 is fixed to the circuit board 20 (P1). Next, the packing 19 is fitted along the inner circumferential surface of the case 12, thereby pressing the outer edge of the solar panel 16 and temporarily fixing the solar panel 16 (P2).

Then, the dial cover 15 is fitted and fixed to the inner surface of the packing 19 (P3). Further, the crystal 17 is fitted and fixed to the case 12 (P4). These P1 to P4 produce the exterior component of the electronic timepiece 1.

After the solar panel 16 and the crystal 17 are fixed in their proper positions, internal components, such as the dial 13, the hands 14 and the circuit board 20, are inserted and arranged in the exterior component (case 12) and connected (P5). An electrode(s) at the tip of the wiring plate 161 is fixed to the circuit board 20 by a screw or the like (P6). After necessary fixation of other components, attachment of the battery 22 and so forth are done, the back cover 18 is fixed to the case 12 by a screw member(s), thereby sealing off the case 12 (P7).

The exterior-component assembly in P1 to P4 and the interior assembly in P5 to P7 may be performed separately by separate manufacturing processes and/or at different manufacturing locations. Further, the insertion of the internal components may be performed before the exterior-component assembly.

Thus, the solar panel 16 is positioned and placed on the step surface 121 while being temporarily fixed by the packing 19. This makes it easy to fix the solar panel 16 in its proper position stably. Further, even if misalignment occurs and the solar panel 16 needs to be reset, it is easy to do so because the solar panel 16 is not fixed by an adhesive.

As described above, the electronic timepiece 1 of this embodiment includes: the cylindrical case 12 with at least the upper end open; the dial 13 and the hands 14 as the display disposed in the case 12 and exposed to the upper end side; the annular light-transmitting dial cover 15 along the inner circumferential surface of the case 12; the annular solar panel 16 disposed under the dial cover 15; and the annular packing 19 that fixes the outer edge of the solar panel 16.

Thus, the solar panel 16 is disposed under the light-transmitting dial cover 15. Hence, the solar panel 16 can generate electric power stably with no influence of display on the display screen. Further, the dial 13 is no longer limited to a light-transmitting member for the solar panel 16. Hence, restrictions on design of the dial 13 decrease, and electronic devices with a greater variety of designs are produced. The annular solar panel 16 can be inserted into the case 12 even if there is misalignment in the circumferential direction. However, if there is such misalignment, the solar panel 16 may be eventually out of relative positions with other components and not connected thereto, or the other components may not fit in the case 12. The electronic timepiece 1 can be assembled with the solar panel 16 temporarily fixed by the packing 19. This can prevent the abovementioned misalignment. Further, in the electronic timepiece 1, no adhesive is used for fixing the solar panel 16. Hence, even if the abovementioned misalignment occurs, reassembling the electronic timepiece 1 is easy. In addition, since no consideration needs to be given to influence of heating of a thermosetting adhesive, which is often used, on the internal components, the electronic timepiece 1 can be assembled/manufactured with less time and effort to select components, make thermal design, and control temperature in assembling/manufacturing the electronic timepiece 1.

Further, the dial cover 15 is fitted in the case 12 via the packing 19, the case 12 is provided with the annular step surface 121 and has an inner diameter that is larger above the step surface 121 than under the step surface 121, and the outer edge of the solar panel 16 is fixed on the step surface 121 by the packing 19.

Thus, the solar panel 16 is interposed and fixed between the packing 19 and the step surface 121. Hence, it is easy to fix the solar panel 16 in the electronic timepiece 1. Further, the packing 19, which fixes the solar panel 16, also fixes the dial cover 15. This makes it possible to fix the solar panel 16 and the dial cover 15 with proper orientations stably, without taking up much space.

Further, the solar panel 16 is separated from the dial cover 15. The packing 19 partly and slightly interposed between the solar panel 16 and the light-transmitting dial cover 15 separates the solar panel 16 and the light-transmitting dial cover 15 from one another. This prevents moiré or the like due to their contact from appearing, and accordingly, if not prevents, reduces deterioration in the external appearance of the electronic timepiece 1.

The electronic timepiece 1 further includes: the wiring plate 161 having one end that is connected to the solar panel 16 to transmit electric power generated by the solar panel 16; and the coating film (162/151) at least at the connection position where the wiring plate 161 is connected to the solar panel 16. Due to the dial cover 15 being light-transmitting, the solar panel 16 thereunder is visible. Providing coatings appropriately so as to make, for example, the connecting member, its connection mark and the notch 16a related to the connection unnoticeable improves design of the electronic timepiece 1.

Further, the solar panel 16 has the notch 16a in the inner circumference side, and the wiring plate 161 is integrated with the solar panel 16 and extends from the notch 16a.

The wiring plate 161 branching off from the solar panel 16 at a position close to the outer circumference of the electronic timepiece 1 prevents itself from protruding to the inside of the case 12 even if the wiring plate 161 is not bent a steep angle but bent (curved) a certain radius of curvature or more. Hence, in this electronic timepiece 1, the wiring plate 161 does not get in a space for the drive unit, the circuit board 20 and so forth. Further, since the wiring plate 161 is not bent a steep angle, the electronic timepiece 1 can prevent disconnection due to deterioration of signal lines, which tends to occur at steeply-bent portions (portions having angles).

Further, the solar panel 16 may include the coating film(s) 162 that is disposed on the upper surface of a portion(s) of the solar panel 16 and reduces visibility from above to below. Since the dial cover 15 is light-transmitting, the solar panel 16 thereunder is visible. Use of the coating film(s) 162 to the extent that decrease in the power generation efficiency does not become a problem can improve design of the electronic timepiece 1. For example, the fixing position (connection position) for the wiring plate 161, which is connected to the solar panel 16, or the like being visible deteriorates the external appearance. Making such a portion invisible or hardly visible as appropriate can, if not prevent, reduce deterioration in the external appearance.

Further, the solar panel 16 includes the solar cells 160, and the coating film(s) 162 may be disposed so as to cover the boundary(ies) between the solar cells 160 in a plan view of the solar panel 16 from above.

Since no electric power is generated at the boundary portion(s) of the solar cells 160, covering this portion(s) with the coating film(s) 162 can further reduce decrease in the power generation efficiency and improve design of the electronic timepiece 1.

Further, the dial cover 15 may include, on its lower surface, the coating film(s) 151 that reduces visibility of a portion(s) of the solar panel 16 from above. That is, the dial cover 15 having the coating film(s) 151 instead of the solar cells 160 (solar panel 16) having the coating film(s) 162 can also improve design of the electronic timepiece 1. The dial cover 15 having the coating film(s) 151 can reduce visibility of the notch 16a too, on which no coating film 162 of the solar cells 160 can be disposed, by having the coating film 151 at a portion corresponding to the notch 16a. This can, if not prevent, reduce deterioration in the external appearance appropriately.

Further, the electronic timepiece 1 includes the dial 13, the hands 14 rotatable on the dial 13, and the circuit board 20. The circuit board 20 has a controller that operates as the time counter that counts the current time and the display controller that causes the hands 14 to display the current time.

In the electronic timepiece 1, which is required to have high levels of portability and continuous operation, the solar panel 16 is disposed under the dial cover 15 so as to be off the underneath of the dial 13. This can more stably and continuously supply electric power and also improve design of the electronic timepiece 1.

Further, the method for assembling the electronic timepiece 1 of this embodiment includes: housing the display (dial 13 and hands 14) in the cylindrical case 12 with at least the upper end open such that the display is exposed to the upper-end side; placing the annular solar panel 16 on the annular step surface 121 of the case 12 the inner diameter of which is larger above the step surface 121 than under the step surface 121; pressing the outer edge of the solar panel 16 from its upper surface side with the annular packing 19, thereby fixing the solar panel 16 on the step surface 121; and fixing the annular light-transmitting dial cover 15 along the upper end of the inner circumferential surface of the case 12 via the packing 19.

Thus, the dial cover 15 is fitted in the state in which the solar panel 16 is fixed by the packing 19. Hence, the dial cover 15 can be fixed in the state in which the position of the solar panel 16, in the rotational direction in particular, is aligned with the connection position thereof to the circuit board 20, for example. This assembling method can reduce occurrence of a situation where re-fixing due to misalignment or the like is required, and accordingly reduce time and effort to manufacture the electronic timepiece 1. Further, even if misalignment occurs, the packing 19 allows, unlike an adhesive, detachment and readjustment of the components, which can reduce manufacturing failure, and accordingly reduce costs or the like.

The technology disclosed in JP 2003-270366 A is an electronic timepiece in which a solar panel is disposed along the side surface of a space between a display and a crystal. Hence, incident light from the side tends to cast a shadow on part of the side surface depending on the orientation of the electronic device, which sometimes reduces the power generation efficiency in the end. As compared with this technology disclosed in JP 2003-270366 A, the electronic timepiece 1 can perform solar power generation efficiently.

The present disclosure is not limited to the above embodiment, and various modifications can be made.

For example, in the above embodiment, the bendable wiring plate 161 is connected to or integrated with the solar panel 16, but not limited thereto. For example, a wiring member that connects an electrode terminal of the solar panel 16 and an electrode terminal of the circuit board 20 in a straight line, such as a coil spring, may be used. In this case, the electrode terminal of the circuit board 20 is disposed on the upper surface of the circuit board 20.

Further, the shape of the inner circumferential surface of the case 12 and the abovementioned annular components does not need to be a circle. For example, their shape may be an oval, a square, a square with rounded corners, or the like.

Further, in the above embodiment, the packing 19 is partly interposed between the solar panel 16 and the dial cover 15 to separate these from one another, but not limited thereto. Another object may be interposed therebetween, or no object may be interposed but the shape of the inner surface of the case 12 may be determined to be able to separate the solar panel 16 and the dial cover 15 from one another. Alternatively, the solar panel 16 and the dial cover 15 may not be completely separated from one another.

Further, if the wiring plate 161 is not integrated with the solar panel 16, the notch 16a may not be provided.

Further, the step surface 121 may be the upper surface of a protrusion of part of the inner circumferential surface. In this case, in addition to the protrusion, the step surface 121 may not be completely annular, but have some cuts. In this case too, the abovementioned processes for making the inside not visible through the light-transmitting dial cover 15 more than necessary may be performed.

Further, in the above embodiment, the electronic device is an analog electronic timepiece including hands, but not limited thereto. The electronic device may be an electronic device including a digital display, such as a liquid crystal display screen. The electronic device may not even be an electronic timepiece, the main function of which is to display the current time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-207870, filed Dec. 22, 2021 which is hereby incorporated by reference wherein in its entirety.

What is claimed is:

1. An electronic device comprising:

a case with at least an upper end open;

a display disposed in the case and exposed to a side where the upper end is located;

an annular light-transmitting parting member disposed along an inner circumferential surface of the case;

an annular solar panel disposed under the annular light-transmitting parting member; and an elastic member that fixes an outer edge of the annular solar panel to the inner circumferential surface of the case.

2. The electronic device according to claim 1, wherein the annular light-transmitting parting member is fitted in the case via the elastic member, wherein the case is provided with a step surface, and has an inner diameter that is larger above the step surface than under the step surface, and wherein the outer edge of the annular solar panel is fixed on the step surface by the elastic member.

3. The electronic device according to claim 1, wherein the annular solar panel is separated from the annular light-transmitting parting member.

4. The electronic device according to claim 1, further comprising:

a wiring part having one end that is connected to the annular solar panel to transmit electric power generated by the annular solar panel; and a coating film at least at a connection position where the wiring part is connected to the annular solar panel.

5. The electronic device according to claim 4, wherein the annular solar panel has a notch in an inner circumference side thereof, and wherein the wiring part is integrated with the annular solar panel and extends from the notch.

6. The electronic device according to claim 1, wherein the annular solar panel includes a coating film that is disposed on an upper surface of a portion of the annular solar panel and reduces visibility from above to below.

7. The electronic device according to claim 6, wherein the annular solar panel includes a plurality of solar cells, and wherein the coating film is disposed so as to cover a boundary between the solar cells in a plan view of the annular solar panel from above.

8. The electronic device according to claim 1, wherein the parting member includes, on a lower surface thereof, a coating film that reduces visibility of a portion of the annular solar panel from above.

9. The electronic device according to claim 1, further comprising a circuit board configured to:

compute current time, and cause the display to display the current time.

10. A method for assembling an electronic device, the method comprising:

fixing an annular solar panel to an inner circumferential surface of a case with an elastic member, wherein at least an upper end of the case is open;

disposing an annular light-transmitting parting member above the annular solar panel and along the inner circumferential surface of the case; and housing a display in the case such that the display is exposed to a side where the upper end is located.

11. The method according to claim 10, wherein the case is provided with a step surface, and has an inner diameter that is larger above the step surface than under the step surface, and wherein fixing the annular solar panel includes placing the annular solar panel on the step surface.

12. The method according to claim 11, wherein fixing the annular solar panel includes fitting the elastic member along the inner circumferential surface of the case, thereby pressing an outer edge of the annular solar panel with the elastic member and temporarily fixing the annular solar panel.

13. The method according to claim 12, wherein fixing the annular solar panel includes fixing the outer edge of the annular solar panel on the step surface with the elastic member.

14. The method according to claim 10, wherein disposing the annular light-transmitting parting member includes fitting the annular light-transmitting parting member to an inner surface of the elastic member, thereby fixing the annular light-transmitting parting member.

15. The method according to claim 14, wherein disposing the annular light-transmitting parting member includes interposing the elastic member between the annular solar panel and the parting member, thereby fixing the annular light-transmitting parting member in a state in which the annular solar panel and the annular light-transmitting parting member are separated from one another.

16. The method according to claim 10, wherein the display includes at least a dial and a hand.

17. The method according to claim 10, wherein housing the display in the case includes housing the display such that the display is disposed at a position inward from an inner edge of the parting member.

18. The method according to claim 10, wherein the display includes at least a dial and a hand, and wherein housing the display in the case includes housing the display such that at least the dial and the hand are disposed at a position inward from an inner edge of the annular light-transmitting parting member.

19. The method according to claim 10, wherein the annular solar panel includes:

a plurality of solar cells; and a coating film that is disposed on an upper surface of a portion of the annular solar panel and reduces visibility from above to below, and wherein the coating film is disposed so as to cover a boundary between the solar cells in a plan view of the annular solar panel from above.

20. The method according to claim 10, wherein the annular light-transmitting parting member includes, on a lower surface thereof, a coating film that reduces visibility of a portion of the annular solar panel from above, and wherein disposing the annular light-transmitting parting member includes adjusting an orientation of the parting member so as to reduce the visibility of the portion of the annular solar panel.

* * * * *